United States Patent [19]

Sakai et al.

[11] Patent Number: 5,036,223
[45] Date of Patent: Jul. 30, 1991

[54] INVERTER CIRCUIT AND CHOPPER TYPE COMPARATOR CIRCUIT USING THE SAME

[75] Inventors: Hideo Sakai, Yokohama; Kiyoharu Oikawa, Kawasaki; Tomotaka Saito, Yokohama, all of Japan

[73] Assignee: Kabushiki Kaisha Toshiba, Kawasaki, Japan

[21] Appl. No.: 525,041

[22] Filed: May 18, 1990

[30] Foreign Application Priority Data

May 22, 1989 [JP] Japan .................. 1-128302

[51] Int. Cl.⁵ .................. H03K 5/24; H03K 17/04
[52] U.S. Cl. .................. 307/448; 307/583; 307/362
[58] Field of Search .................. 363/17; 307/448, 443, 307/451, 452, 303.2, 583, 355, 362

[56] References Cited

U.S. PATENT DOCUMENTS

| | | | |
|---|---|---|---|
| 4,451,745 | 5/1984 | Itoh et al. | 307/583 |
| 4,472,643 | 9/1984 | Furuyama | 307/583 |
| 4,472,644 | 9/1984 | Kirsch | 307/583 |
| 4,529,897 | 7/1985 | Suzuki et al. | 307/583 |
| 4,570,091 | 2/1986 | Yasuda et al. | 307/583 |
| 4,761,567 | 8/1988 | Walters, Jr. et al. | 307/303.2 |
| 4,808,848 | 2/1989 | Miller | 307/362 |
| 4,816,701 | 3/1989 | Ando et al. | 307/355 |
| 4,890,016 | 12/1989 | Tanaka et al. | 307/443 |
| 4,902,913 | 2/1990 | Hein et al. | 307/362 |

OTHER PUBLICATIONS

ISSCC 88; Session VI: Integrated Signal-Processing Subsystems, WPM 6.2: A Signal Processor for Voice-band Applications; Nagai et al., Feb. 17, 1988, pp. 60–61.

Primary Examiner—David Hudspeth
Assistant Examiner—Andrew Sanders
Attorney, Agent, or Firm—Finnegan, Henderson, Farabow, Garrett, and Dunner

[57] ABSTRACT

An inverter circuit according to this invention includes n- and p-type field effect transistors having predetermined wiring resistances and gates and drains connected with each other, a first power source connected to the source of the n-type field effect transistor, a power source connected to the source of the p-type field effect transistor, and first and second negative feedback switching transistors connected in parallel between the gates and the drains of the n- and p-type field effect transistors. Assuming that the channel length and width of the first insulating gate field effect transistor are $L_N$ and $W_N$, respectively, and the wiring resistance thereof is $R_S$, that the channel length and width of the second insulating gate field effect transistor are $L_P$ and $W_P$, respectively, and the wiring resistance thereof is $R_D$, and that carrier mobilities of the first and second insulating gate field effect transistors are $\mu_N$ and $\mu_P$, respectively, a relation represented by:

$$\frac{R_S}{R_D} = \sqrt{\left(\frac{W_P}{L_P} \bigg/ \frac{W_N}{L_N}\right) \cdot \frac{\mu_P}{\mu_N}}$$

is approximately satisfied. A voltage corresponding to a difference between a reference voltage and a comparison input is input from the connected gates, and data is output from the connected drains.

7 Claims, 6 Drawing Sheets

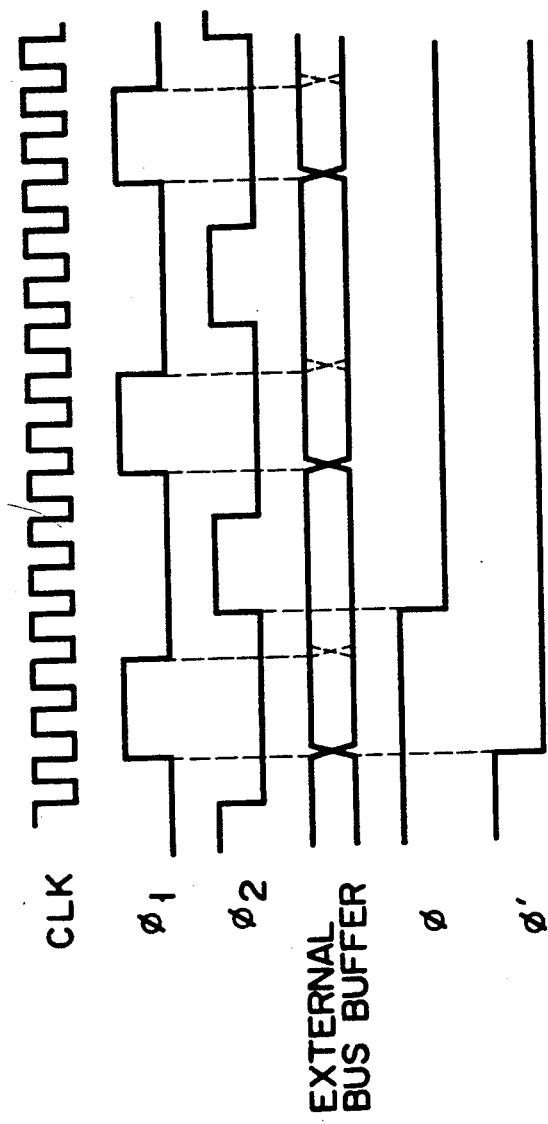

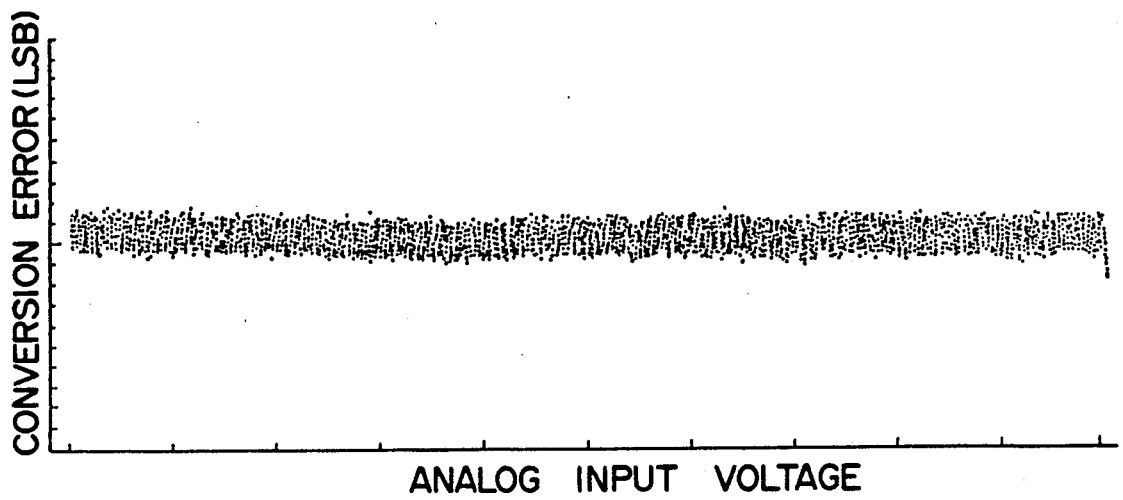
F I G. 8A
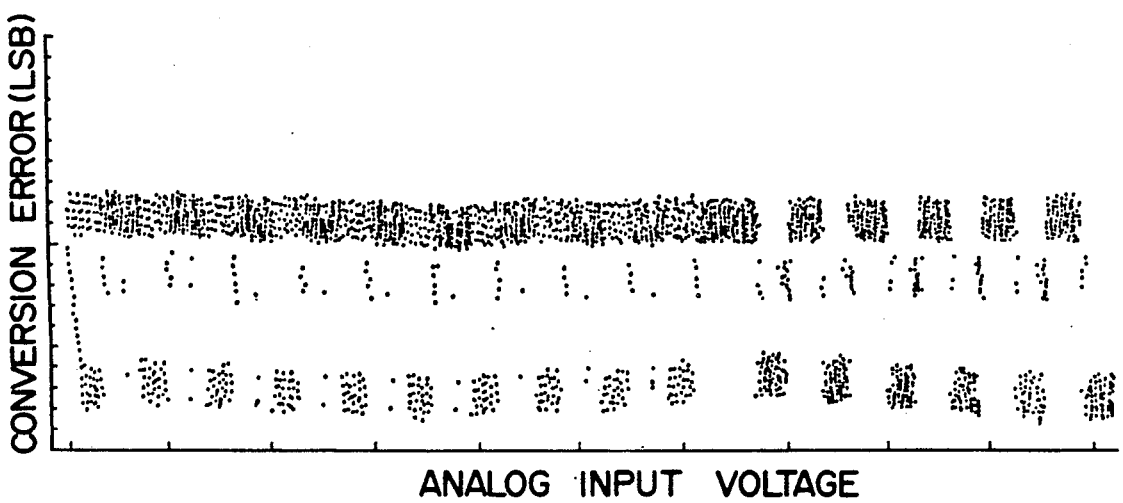
F I G. 8B

INVERTER CIRCUIT AND CHOPPER TYPE COMPARATOR CIRCUIT USING THE SAME

BACKGROUND OF THE INVENTION

1. Field of the Invention

The present invention relates to an inverter circuit and a chopper type comparator circuit using the inverter circuit and, more particularly, to an inverter circuit for a semiconductor IC and a chopper type comparator circuit using the inverter circuit.

2. Description of the Related Art

A chopper type comparator often used in a conventional A/D converter is arranged, e.g., as shown in FIG. 1. Referring to FIG. 1, reference numeral 12 denotes a chopper type comparator main body, and a sample-and-hold circuit 14 of the chopper type comparator is provided adjacent to the main body 12. In the main body 12, n- and p-type field effect transistors (IGFETs) $Q_1$ and $Q_2$ constituting an inverter 16, negative feedback switching transistors $Q_3$ and $Q_4$, and power sources $V_{DD}$ and $V_{SS}$ are connected as shown in FIG. 1. The sample-and-hold circuit 14 includes switches SW1 and SW2 to be ON- or OFF-controlled by signals $\phi$ and $\bar{\phi}$, and a capacitor C. Note that reference symbol $A_{in}$ denotes a comparison input voltage; and $V_{ref}$ a reference voltage.

Referring to FIG. 1, the switch SW1 at the $A_{in}$ side and the negative feedback switches $Q_3$ and $Q_4$ of the inverter 16 are turned on to store an electrical charge in the capacitor C. Since the input and output terminals of the inverter 16 are short-circuited, a potential at a point A is equal to a circuit threshold value $V_C$ of the inverter 16. Therefore, a charge Q stored in the capacitor C is represented by:

$$Q=(V_C-A_{in})C \qquad (1)$$

Subsequently, the switch SW1 and the negative feedback switches $Q_3$ and $Q_4$ are turned off, and the switch SW2 at the $V_{ref}$ side is turned on. Since the charge amount stored in the capacitor C remains unchanged, the following equation is obtained assuming that the potential at the point A is $V_A$:

$$Q=(V_A-V_{ref})C \qquad (2)$$

From equations (1) and (2), the following equation (3) is obtained:

$$V_A=V_C+(V_{ref}-A_{in}) \qquad (3)$$

FIG. 2 is a graph showing input/output characteristics of a typical inverter. An intersection between a straight line $V_{in}=V_{out}$ and a characteristic curve represents the threshold value $V_C$ of the inverter. As is apparent from FIG. 2, if an input voltage is shifted even slightly from $V_C$, the shift appears in an amplified form in an output. That is, the following equations are obtained:

$$V_1'-V_C=\alpha_1(V_C-V_1)$$

$$V_C-V_2'=\alpha_2(V_2-V_C)$$

where $\alpha_1$ and $\alpha_2$ are the amplification factors of the inverter 16.

According to equation (3), therefore, if $A_{in}$ is lower than $V_{ref}$ an output $V_{A1}(=V_{out})$ from the comparator is given by:

$$V_{A1}=V_C+\alpha_1(V_{ref}-A_{in}) \qquad (4)$$

for $\alpha_1>1$

If $A_{in}$ is higher than $V_{ref}$ an output $V_{A2}(=V_{out})$ from the comparator is given by:

$$V_{A2}=V_C+\alpha_2(V_{ref}-A_{in}) \qquad (5)$$

for $\alpha_2>1$

A conventional comparator circuit has a problem of offset caused by a power source resistance. That is, the input terminal of the inverter 16 is at an intermediate level upon sampling (i.e., when all of the switches SW1, $Q_3$, and $Q_4$ are turned on to store an electrical charge in the capacitor C). Therefore, both the p- and n-type transistors $Q_2$ and $Q_1$ in the inverter 16 are turned on to flow through current between the power sources $V_{DD}$ and $V_{SS}$. Assuming that the through current is $I_P$ and power source resistances of the inverter 16 at the reference power source side ($V_{SS}$ side) and the supply power source side ($V_{DD}$ side) are $R_S$ and $R_D$ respectively, a potential at the $V_{SS}$ side rises from the ground level toward the positive side by $I_P R_S$ and that at the $V_{DD}$ side falls by $I_P R_D$. In this case, the circuit threshold value $V_C$ is obtained as:

$$V_C = \frac{\beta_N V_{TN} + \beta_P((V_{DD} - I_P R_D) - I_P R_S - |V_{TP}|)}{\beta_N + \beta_P} + I_P R_S \qquad (6)$$

$$= \frac{\beta_N V_{TN} + \beta_P(V_{DD} - |V_{TP}|) + I_P(\beta_N R_S - \beta_P R_D)}{\beta_N + \beta_P}$$

for $\beta_N = \sqrt{\frac{W_N}{2L_N}\frac{\epsilon_{OX}}{t_{OX}}\mu_N}$, $\beta_P = \sqrt{\frac{W_P}{2L_P}\frac{\epsilon_{OX}}{t_{OX}}\mu_P}$ (where $V_{TN}$ and $V_{TP}$ are the threshold voltages of the n- and p-type transistors, $L_N$ and $W_N$ are the length and the width of the n-type transistor, $L_P$ and $W_P$ are the length and the width of the p-type transistor, $\mu_N$ and $\mu_P$ are the mobilities of electrons and holes, and $\epsilon_{OX}$ and $t_{OX}$ are the dielectric constant and the thickness of a gate oxide film.)

When a comparison period (in which only the switch SW2 is turned on, i.e., a state opposite to the sampling state described above) starts, the input potential of the inverter changes from $V_C$. Therefore, the through current changes to $I_P'$. In this case, the circuit threshold value $V_C'$ is obtained as.

$$V_C' = \frac{\beta_N V_{TN} + \beta_P(V_{DD} - |V_{TP}|) + I_P'(\beta_N R_S - \beta_P R_D)}{\beta_N + \beta_P} \qquad (7)$$

That is, $V_C$ and $V_C'$ satisfy the following relation:

$$V_C' = V_C + \Delta V$$

for $\Delta V = \frac{(I_P' - I_P)(\beta_N R_S - \beta_P R_D)}{\beta_N + R_D}$

Therefore, a charge Q' stored in the actual capacitor C upon sampling is given by:

$$Q' = (V_C + \Delta V - A_{in})C$$

From the above equation, the potential $V_A$ at the point A upon comparison is represented as follows:

$$V_A = V_C + (V_{ref} - A_{in}) + \Delta V \qquad (8)$$

From comparison between equations (3) and (7), an offset $\Delta V$ is produced in the prior art.

In order to reduce the offset caused by a power source resistance, efforts have been conventionally made to decrease the value of the power source resistance to be as low as possible. As a result, the thickness of a power source line is increased to increase the size of a chip. In addition, since the resistance is decreased to be as low as possible, the mounting position of a comparator is limited.

A conventional chopper type comparator is used in a single analog chip such as an A/D converter and is not used together with a large-scale digital circuit. In addition, a conventional chopper type comparator has no sufficient countermeasure against noise produced in a digital circuit.

An influence of noise on a chopper type comparator will be described below. A sampling period ends at an opening timing of the self-bias switches $Q_3$ and $Q_4$ of the inverter 16. If, however, noise is superposed on the power source to vary the circuit threshold value $V_C$ of the inverter 16 from $V_C$ to $V_C + \Delta V$ immediately before the switches $Q_3$ and $Q_4$ are opened, a charge amount $Q''$ to be stored in the capacitor C is given by:

$$Q'' = C(V_C - (A_{in} - \Delta V_C))$$

and a value $A_{in}'$ represented by the following equation is assumed to be input:

$$A'_{in} = A_{in} - \Delta V_C$$

Even if the switches $Q_3$ and $Q_4$ are opened in this state to eliminate an influence of the noise and the circuit threshold value of the inverter 16 returns to $V_C$ the charge amount of the capacitor C is still subjected to the influence of the noise, and the input voltage is offset by $-\Delta V_C$ and compared.

In a digital LSI chip such as an MPU (Micro Processor Unit) or an MCU (Micro Control Unit), it is well known that the power source noise described above is produced upon switching of an external bus buffer for driving a peripheral IC of an external bus of a digital LSI chip.

When a chopper type comparator is used in a single analog chip, switching of the external bus buffer is performed after the comparison period described above is finished. That is, since switching is not performed in the sampling period, it is not affected by the above noise. When a chopper type comparator is used together with a digital circuit such as a microcomputer, however, digital noise (external bus buffer switching noise) may be produced regardless of a sampling period and a comparison period since a digital portion and an analog portion operate independently of each other. As a result, precision of the comparator may be degraded.

As an attempt to eliminate an influence of the above noise or to reduce the noise to be negligible, an arrangement in which an analog clock is formed such that its phase is shifted from that of a digital clock is described in K. Nagai, "A Signal Processor for Voiceband Applications", ISSCC DIGEST OF TECHNICAL PAPERS; PP. 60–61, Feb., 1988. The arrangement of this reference, however, is not so preferable since (i) an exclusive circuit for forming an analog clock is required,
(ii) an RF source oscillation clock is required, and
(iii) when an analog circuit is mounted together with a digital circuit, it is generally difficult to perfectly offset synchronization of circuit operations in timing design because an operation frequency margin must be considered.

SUMMARY OF THE INVENTION

It is an object of the present invention to simply reduce or eliminate variations in a circuit threshold value of an inverter caused by a power source resistance which is inevitable in a conventional arrangement.

It is another object of the present invention to solve a conventional problem of degradation in conversion precision of an A/D converter caused since a self-bias switch of a chopper type comparator is turned off while noise is produced upon switching of an external bus buffer or the like, by offsetting an OFF timing of the self-bias switch of the chopper type comparator from a switching timing of the buffer or the like to eliminate an influence of the switching noise.

According to one aspect of the present invention, there is provided an inverter circuit comprising a first insulating gate field effect transistor of a first conductivity type, having a predetermined channel length, a predetermined channel width, and a predetermined wiring resistance, and including gate, source, and drain electrodes, a second insulating gate field effet transistor of a second conductivity, having a predetermined channel length, a predetermined channel width, and a predetermined wiring resistance, and including gate, source, and drain electrodes, the gate and drain electrodes of the second insulating gate field effect transistor being respectively connected to the gate and drain electrodes of the first insulating gate field effect transistor, first power source means connected to the source electrode of the first field effect transistor, and second power source means different from the first power source means and connected to the source electrode of the second field effect transistor, wherein assuming that the channel length and width of the first insulating gate field effect transistor are $L_N$ and $W_N$, respectively, and the wiring resistance thereof is $R_S$, that the channel length and width of the second insulating gate field effect transistor are $L_P$ and $W_P$, respectively, and the wiring resistance thereof is $R_D$, and that carrier mobilities of the first and second insulating gate field effect transistors are $\mu_N$ and $\mu_P$, respectively, a relation represented by:

$$\frac{R_S}{R_D} = \sqrt{\left(\frac{W_P}{L_P} \Big/ \frac{W_N}{L_N}\right) \cdot \frac{\mu_P}{\mu_N}}$$

is approximately satisfied.

According to another aspect of the present invention, there is provided a chopper type comparator circuit comprising an inverter circuit including a first insulating gate field effect transistor of a first conductivity type, having a predetermined channel length, a predetermined channel width, and a predetermined wiring resistance, and including gate, source, and drain electrodes, a second insulating gate field effect transistor of a second conductivity, having a predetermined channel length, a predetermined channel width, and a predetermined wiring resistance, and including gate, source, and drain electrodes, the gate and drain electrodes of the second insulating gate field effect transistor being respectively connected to the gate and drain electrodes of the first insulating gate field effect transistor, first power source means connected to the source electrode of the first field effect transistor, and second power source means different from the first power source means and connected to the source electrode of the second field effect transistor, wherein assuming that the channel length and width of the first insulating gate field effect transistor are $L_N$ and $W_N$, respectively, and the wiring resistance thereof is $R_S$, that the channel length and width of the second insulating gate field effect transistor are $L_P$ and $W_P$, respectively, and the wiring resistance thereof is $R_D$, and that carrier mobilities of the first and second insulating gate field effect transistors are $\mu_N$ and $\mu_P$, respectively, a relation represented by:

$$\frac{R_S}{R_D} = \sqrt{\left(\frac{W_P}{L_P} \bigg/ \frac{W_N}{L_N}\right) \cdot \frac{\mu_P}{\mu_N}}$$

is approximately satisfied, and self-biased switching means, connected between the gate electrodes connected as an input end of the first and second insulating gate field effect transistors of the inverter circuit and the drain electrodes connected as an output end thereof, for opening/closing a path between the input and output ends in accordance with sampling of a comparison input and comparison between the comparison input and a reference voltage, the input end of the inverter circuit receiving a voltage corresponding to a difference between the reference voltage and the comparison input.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A through 7F are timing charts for explaining an operation of the inverter shown in FIG. 6;
and
FIGS. 8A and 8B are graphs showing a conversion precision of an A/D converter as a function of an analog input voltage of the chopper type comparator, in which
FIG. 8A shows the result obtained when the inverter shown in FIG. 6 is incorporated in an MCU and FIG. 8B shows the result obtained when it is not incorporated.

DETAILED DESCRIPTION OF THE PREFERRED EMBODIMENTS

Figure 1:
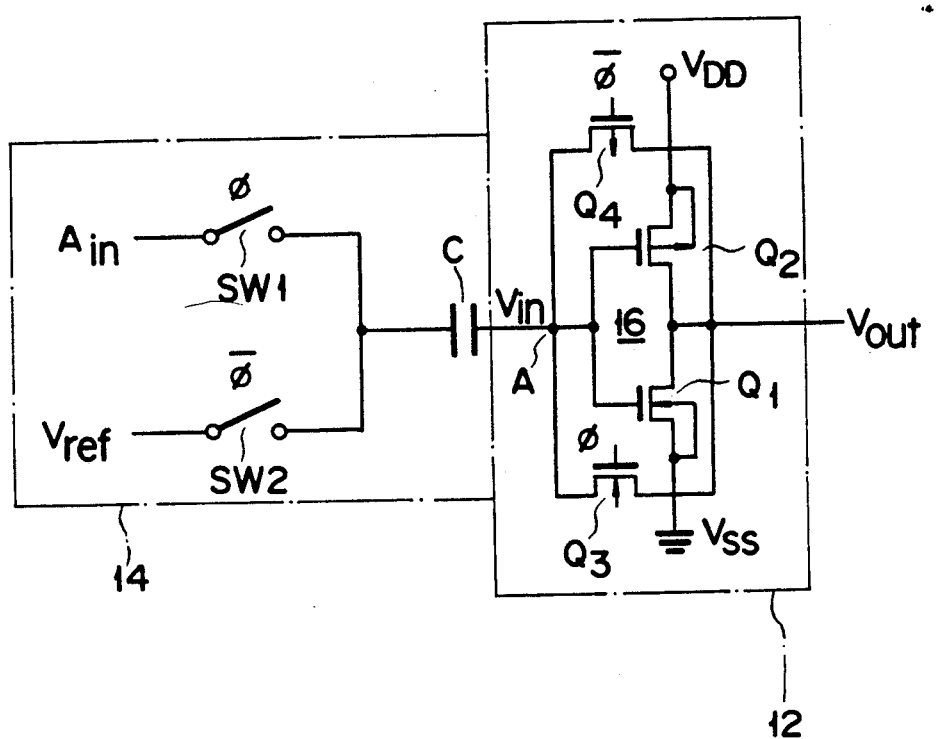
FIG. 1 is a circuit diagram showing a chopper type comparator circuit according to a prior art.
Figure 2:
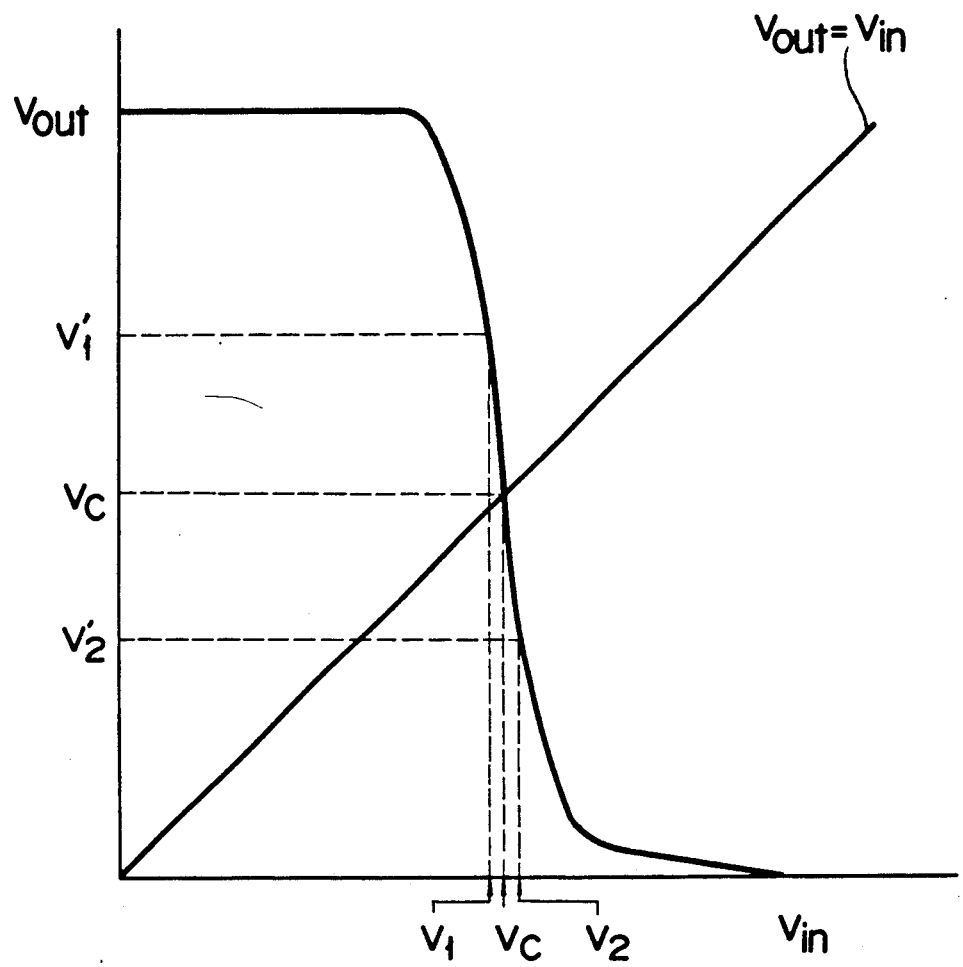
FIG. 2 is a graph showing input/output characteristics of a typical inverter.

The offset $\Delta V$ is produced in the above prior art since variation term "$I_P(\beta_N R_S - \beta_P R_D)$" in circuit threshold value is present in equation (6) described above. If, therefore, a relation below:

$$\beta_N R_S = \beta_P R_D \tag{9}$$

is satisfied in this term, the variation in circuit threshold value is assumed to become zero. Equation (9) can be rewritten as follows:

$$\frac{R_S}{R_D} = \frac{\beta_P}{\beta_N} = \frac{\sqrt{\frac{W_P}{2L_P} \cdot \frac{\epsilon_{OX}}{t_{OX}} \mu_P}}{\sqrt{\frac{W_N}{2L_N} \cdot \frac{\epsilon_{OX}}{OX} \mu_N}} \tag{10}$$

$$= \sqrt{\frac{W_P \mu_P L_N}{W_N \mu_N L_P}}$$

According to the above equation, both the variation in circuit threshold value and the offset $\Delta V$ are zeros.

That is, the present invention focuses on the resistances of power sources $V_{DD}$ and $V_{SS}$ which have not been conventionally taken into consideration so that equation (10) is satisfied between these power source resistances and a circuit constant of an inverter, thereby eliminating the variation in circuit threshold value of the inverter. In a chopper type comparator, for example, $\Delta V$ of equation (8) is 0 V since a circuit threshold value does not change. Therefore, no offset is produced due to $\Delta V$.

In addition, the present invention solves a problem of degradation in precision of a chopper type comparator mounted in a chip also mounting a digital circuit such as an MPU or MCU caused by noise produced by the digital circuit, by offsetting an OFF timing of a self-bias switch of the comparator (a timing at which the logic level of a system fundamental clock $\phi_2$ to be described later changes) from a generation timing (a logic level change timing of a system fundamental clock $\phi_1$ to be described later for driving the external bus buffer) of a digital circuit noise (such as switching noise of an external bus buffer).

Embodiments of the present invention will be described in detail below with reference to the accompanying drawings. In the following embodiments, the same reference numerals as in the above prior art denote the same parts.

Figure 3:
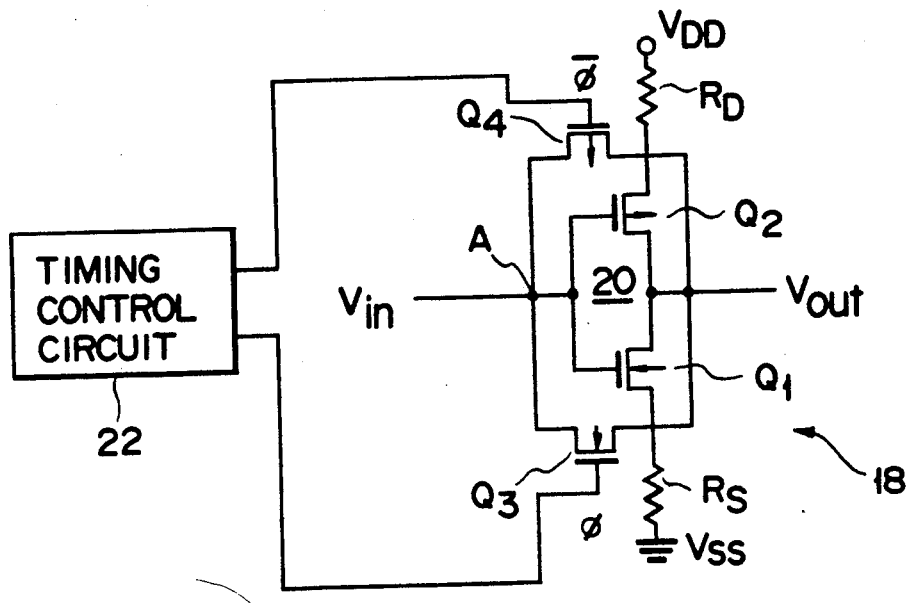
FIG. 3 is a circuit diagram showing a main body of a chopper type comparator circuit according to the first embodiment of the present invention.

FIG. 3 shows a main body of a chopper type comparator circuit according to the first embodiment of the present invention. This comparator circuit 18 has an inverter 20 in which the gates and drains of n- and p-type field effect transistors (IG-FETs) Q₁ and Q₂ are connected with each other. The sources of the transistors Q₁ and Q₂ are connected to power sources $V_{SS}$ and $V_{DD}$ having wiring resistances $R_S$ and $R_D$ respectively. The sources and drains of negative feedback switching transistors Q₃ and Q₄ are connected with each other, and nodes between these sources and drains are connected to nodes between the gates and drains of the transistors Q₁ and Q₂, respectively. An input voltage $V_{in}$ appears at the gate side of the transistors Q₁ and Q₂ and an output voltage $V_{out}$ appears at their drain side. The gates of the transistors Q₃ and Q₄ are connected to an external timing control circuit 22 of the comparator circuit 18. The timing control circuit 22 supplies a control signal $\phi$ to the transistor Q₃ and an inverted signal $\bar{\phi}$ of the control signal $\phi$ to the transistor Q₄.

The wiring resistances $R_S$ and $R_D$ are set by a circuit constant of the inverter 20 so as to satisfy equation (10) described above. If the resistances $R_S$ and $R_D$ of the power source wiring are known beforehand, the circuit constant of the inverter 20 is changed to satisfy equation (10).

That is, the variation "$I_P(\beta_N R_S - \beta_P R_D)$" threshold value in equation (6) can be set to zero if equation (9) is satisfied. For this purpose, the power source wiring resistances $R_S$ and $R_D$ and the circuit constant of the inverter 20 need only satisfy equation (10). That is, the following relation need only be satisfied:

$$\frac{R_S}{R_D} = \frac{\beta_P}{\beta_N} = \sqrt{\left(\frac{W_P}{L_P} \bigg/ \frac{W_N}{L_N}\right) \cdot \frac{\mu_P}{\mu_N}}$$

In this manner, by a simple method of setting the resistances $R_S$ and $R_D$ and the circuit constant of the inverter 20 to satisfy the above relation, the circuit threshold value variation in the inverter 20 can be eliminated to eliminate an offset caused by the power source resistances. In addition, since this effect can be achieved regardless of the magnitudes of the power source resistances, the position of the comparator circuit 18 is not much limited. Furthermore, the thickness of a power source line need not be particularly increased. Therefore, the size of a chip is not increased.

Figure 4:
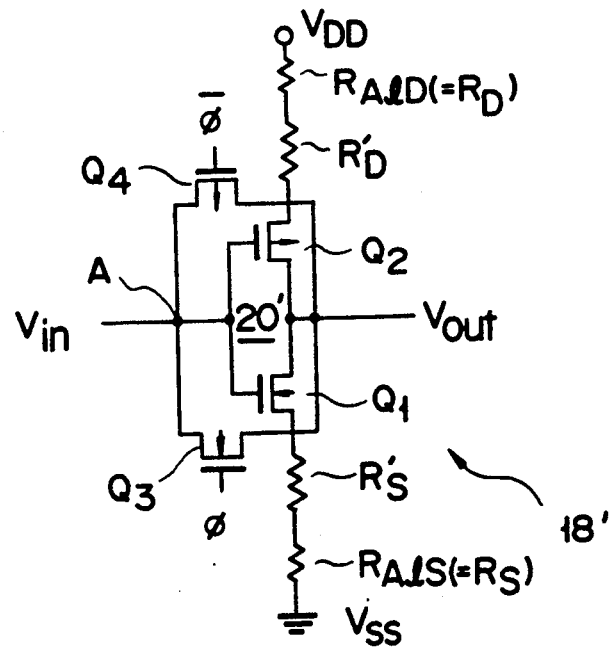
FIG. 4 is a circuit diagram showing a main body of a chopper type comparator circuit according to the second embodiment of the present invention.

FIG. 4 shows a comparator circuit 18' according to the second embodiment of the present invention having an inverter 20' in which aluminum wiring resistors $R_{AIS}$ and $R_{AID}$ (the same as the wiring resistances $R_S$ and $R_D$ of the circuit shown in FIG. 3) and wiring resistances $R_S'$ and $R_D'$ having higher values than those of $R_S$ and $R_D$ are inserted and connected in place of $R_S$ and $R_D$, respectively. In this arrangement, if the values of the resistors $R_{AIS}$ and $R_{AID}$ are so small as to be negligible, a circuit constant can be determined in accordance with only the values of the resistors $R_S'$ and $R_D'$. That is, assuming that the resistances satisfy a relation of $(R_{AIS}, R_{AID}) << (R_S', R_D')$, the following equation is obtained:

$$\frac{R_{S'} + R_{AIS}}{R_{D'} + R_{AID}} \approx \frac{R_{S'}}{R_{D'}}$$

In this case, as in the first embodiment described above, the resistances need only be set to satisfy the following equation:

$$\frac{R_{S'}}{R_{D'}} = \sqrt{\left(\frac{W_P}{L_P} \bigg/ \frac{W_N}{L_N}\right) \cdot \frac{\mu_P}{\mu_N}}$$

Figure 5:
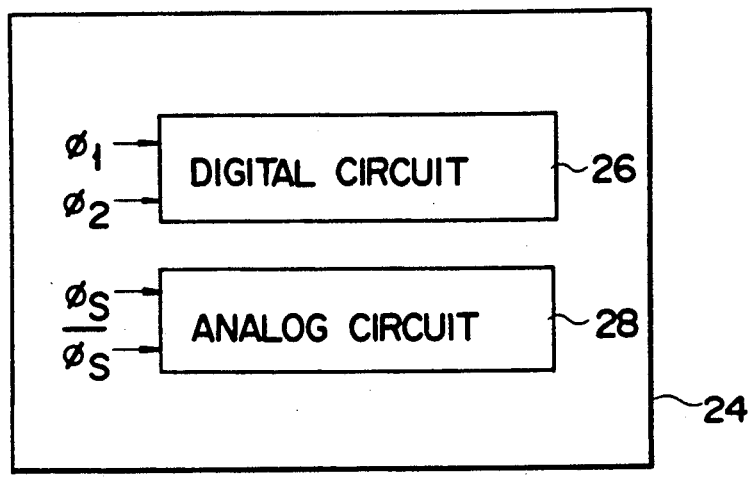
FIG. 5 is a schematic view showing an arrangement of a semiconductor chip mounting a chopper type comparator according to the third embodiment of the present invention.
Figure 6:
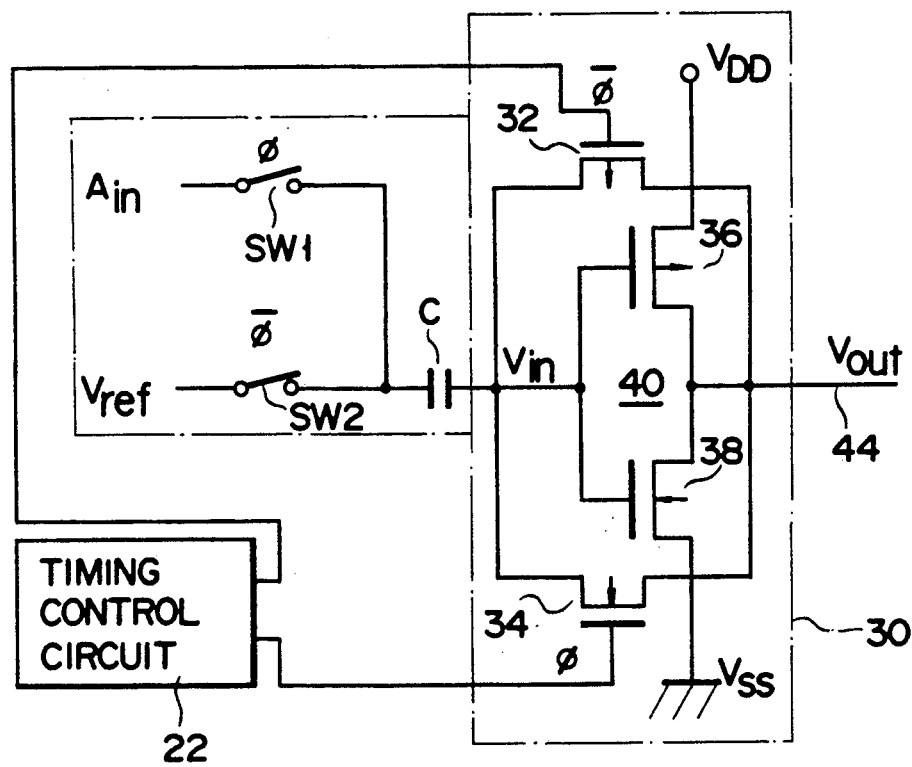
FIG. 6 is a circuit diagram showing an inverter of the chopper type comparator shown in FIG. 5.

FIGS. 5 and 6 show the third embodiment of the present invention, in which FIG. 5 is a schematic view showing an arrangement of a semiconductor chip mounting a chopper type comparator and FIG. 6 is a circuit diagram showing an inverter of the chopper type comparator shown in FIG. 5.

Referring to FIG. 5, a semiconductor chip 24 has both a digital circuit 26 and an analog circuit 28. Assume that a chopper type comparator 30 shown in FIG. 6 is formed as the analog circuit 28. The digital circuit 26 is operated by system fundamental clocks $\phi_1$ and $\phi_2$.

Self-biasing switches 32 and 34 of the comparator 30 shown in FIG. 6 are switching-controlled by a timing signal $\phi$ which falls in synchronism with the leading edge of the system fundamental clock $\phi_2$ and its inverted signal $\bar{\phi}$. The signals $\phi$ and $\bar{\phi}$ and the clocks $\phi_1$ and $\phi_2$ are formed by a timing control circuit 22. A sample-and-hold circuit 42 is connected to the input side ($V_{in}$) of an inverter 40 having field effect transistors 36 and 38. The sample-and-hold circuit 42 has switches SW1 and SW2 to be ON/OFF-controlled by the signals $\phi$ and $\bar{\phi}$ and also has a capacitor C. Note that reference symbol $A_{in}$ denotes a comparison input voltage; and $V_{ref}$ a reference voltage. An external bus 44 for outputting data is provided at the output side ($V_{out}$) of the inverter 40.

An operation of the comparator 30 will be described below with reference to FIGS. 7A through 7F.

A source oscillation clock CLK shown in FIG. 7A is formed by the timing control circuit 22 and 1/6-frequency-divided, for example, to form the system clocks $\phi_1$ and $\phi_2$ (FIGS. 7B and 7C). Although the digital circuit 26 operates in synchronism with the clocks $\phi_1$ and $\phi_2$, it should be noted that switches 34 and 32 of an external bus buffer (FIG. 7D) are opened by timing signals $\phi$ (FIG. 7E) and $\bar{\phi}$, respectively, synchronized with the leading and trailing edges of the clock $\phi_1$. As a result, even if noise is produced at the leading or trailing edge of the clock $\phi_1$, an influence of the noise is eliminated before the leading edge of the clock $\phi_2$, thereby preventing degradation in precision.

A clock $\phi'$ shown in FIG. 7F is obtained when switching control of the self-bias switch is synchronized with the clock $\phi_1$ of an external bus buffer driving. This indicates that when noise is produced at the leading or trailing edges of the clock $\phi_1$, the precision is largely degraded due to an influence of the noise.

In the present invention, the same effect can be obtained when the OFF timing of the switches 32 and 34 is changed from the leading edge of the clock $\phi_2$ to the trailing edge of the clock $\phi_2$.

In the above third embodiment, the source oscillation clock CLK is 1/6-frequency-divided to obtain the clocks $\phi_1$ and $\phi_2$. The present invention, however, is not limited to this embodiment. That is, the same effect can be obtained by using clocks $\phi_1$ and $\phi_2$ not overlapping each other regardless of the number of frequency division times or regardless of whether frequency division is performed.

FIGS. 8A and 8B show conversion errors obtained when the present invention is applied to a chopper type comparator of an A/D converter incorporated in an MCU and when the present invention is not applied thereto. FIG. 8A shows the result obtained when the present invention is not applied to the comparator, in which a self-bias switch is opened at a timing of φ shown in FIG. 7E. FIG. 8B shows the result obtained when the self-bias switch is opened at a timing of φ' shown in FIG. 7F. As shown in FIGS. 8A and 8B, a large error is caused by switching noise of an external bus buffer. Referring to FIG. 8A, however, substantially uniform precision is found to be obtained with respect to an analog input voltage by the same estimation as that in FIG. 8B. That is, since the result shown in FIG. 8A is not adversely affected by the switching noise of the external bus buffer, a considerable precision improvement compared to that shown in FIG. 8B is obtained.

In the embodiment shown in FIGS. 5 through 7, since no analog clock is required, no special clock generating circuit need be used. Therefore, an A/D converter or the like can be easily incorporated in a conventionally used MPU or MCU.

The present invention is not limited to the above embodiments but can be variously modified. That is, although the above description has been made by mainly taking a chopper type comparator as an example, it is a matter of course that the present invention can be applied to a circuit using an inverter as an amplifier.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An inverter circuit comprising:
   an input terminal to which an input voltage is applied;
   a first insulating gate field effect transistor of a first conductivity type, having a predetermined channel length and a predetermined channel width, and including gate, source, and drain electrodes, said gate electrode being connected to said input terminal;
   a second insulating gate field effect transistor of a second conductivity, having a predetermined channel length and a predetermined channel width, and including gate, source, and drain electrodes, said gate and drain electrodes of said second insulating gate field effect transistor being respectively connected to said gate and drain electrodes of said first insulating gate field effect transistor, and said gate electrode of said second transistor being connected to said input terminal;
   a first wiring resistor connected to the source electrode of said first insulating gate field effect transistor and having a predetermined resistance;
   a second wiring resistor connected to the source electrode of said second insulating gate field effect transistor and having a predetermined resistance;
   first power source means connected to said first wiring resistor;
   second power source means different from said first power source means connected to said second wiring resistor; and
   an output terminal, connected to the drains of said first and second insulating gate field effect transistors, for outputting a voltage,
   wherein assuming that the channel length and width of said first insulating gate field effect transistor are $L_N$ and $W_N$, respectively, the resistance of said first wiring resister is $R_S$, the channel length and width of said second insulating gate field effect transistor are $L_p$ and $W_p$, respectively, the resistance of said second wiring resistor is $R_D$, and the carrier mobilities of said first and second insulating gate field effect transistors are $\mu_N$ and $\mu_p$, respectively, a relation represented by:

$$\frac{R_S}{R_D} = \sqrt{\left(\frac{W_P}{L_P} \bigg/ \frac{W_N}{L_N}\right) \cdot \frac{\mu_P}{\mu_N}}$$

is approximately satisfied.

2. A chopper type comparator circuit comprising:
   an inverter circuit including:
   an input terminal to which an input voltage is applied,
   a first insulating gate field effect transistor of a first conductivity type, having a predetermined channel length and a predetermined channel width, and including gate, source, and drain electrodes, said gate electrode being connected to said input terminal,
   a second insulating gate field effect transistor of a second conductivity, having a predetermined channel length and a predetermined channel width, and including gate, source, and drain electrodes, said gate and drain electrodes of said second insulating gate field effect transistor being respectively connected to said gate and drain electrodes of said first insulating gate field effect transistor, and said gate electrode of said second transistor being connected to said input terminal,
   a first wiring resistor connected to the source electrode of said first insulating gate field effect transistor and having a predetermined resistance,
   a second wiring resistor connected to the source electrode of said second insulating gate field effect transistor and having a predetermined resistance,
   first power source means connected to said first wiring resistor,
   second power source means different from said first power source means connected to said second wiring resistor, and
   an output terminal, connected to the drains of said first and second insulating gate field effect transistors, for outputting a voltage,
   wherein, assuming that the channel length and width of said first insulating gate field effect transistor are $L_N$ and $W_N$, respectively, the resistance of said first wiring resister is $R_S$, the channel length and width of said second insulating gate field effect transistor are $L_p$ and $W_p$, respectively, the resistance of said second wiring resister is $R_D$, and the carrier mobilities of said first and second insulating gate field effect transistors are $\mu N$ and $\mu P$, respectively, a relation represented by:

$$\frac{R_S}{R_D} = \sqrt{\left(\frac{W_P}{L_P} \Big/ \frac{W_N}{L_N}\right) \cdot \frac{\mu_P}{\mu_N}}$$

is approximately satisfied, self-bias switching means, connected between said input terminal and said output terminal, for opening/closing a path between the input and output terminals in accordance with sampling of a comparison input and comparison between the comparison input and a reference voltage, the input terminal of said inverter circuit receiving a voltage corresponding to a difference between the reference voltage and the comparison input.

3. A circuit according to claim 2, wherein said self-bias switching means is constituted by a negative feedback switching transistor.

4. A circuit according to claim 2, further comprising a chopper type comparator main body including output means for outputting data to external equipment, and timing control means for supplying a control signal generated at a predetermined timing, an opening timing of said self-biased switching means being different from an operation timing of said output means in synchronism with a fundamental clock generated by said timing control means.

5. A circuit according to claim 4, wherein said chopper type comparator main body is integrated on a single substrate together with a digital circuit including said output means and said timing means.

6. A circuit according to claim 5, wherein said self-biased switching means is opened in synchronism with not a level change timing of a first fundamental clock but a level change timing of a second fundamental clock.

7. A circuit according to claim 6, wherein said chopper type comparator main body receives at said input end a voltage corresponding to a difference between the reference voltage and the comparison input.

* * * * *